(12) United States Patent
Sakai et al.

(10) Patent No.: US 7,396,806 B2
(45) Date of Patent: Jul. 8, 2008

(54) SEMICONDUCTOR CLEANER COMPRISING A REDUCING AGENT, DISPERSANT, AND PHOSPHONIC ACID-BASED CHELANT

(75) Inventors: Akimitsu Sakai, Tokyo (JP); Atsushi Tamura, Wakayama (JP)

(73) Assignee: Kao Corporation, Tokyo (JP)

( * ) Notice: Subject to any disclaimer, the term of this patent is extended or adjusted under 35 U.S.C. 154(b) by 126 days.

(21) Appl. No.: 10/311,471

(22) PCT Filed: Jun. 14, 2001

(86) PCT No.: PCT/JP01/05091

§ 371 (c)(1), (2), (4) Date: Dec. 16, 2002

(87) PCT Pub. No.: WO01/97268

PCT Pub. Date: Dec. 20, 2001

(65) Prior Publication Data

US 2003/0158059 A1   Aug. 21, 2003

(30) Foreign Application Priority Data

Jun. 16, 2000   (JP) ............................. 2000-181141

(51) Int. Cl.
*C11D 3/36* (2006.01)
*C11D 3/37* (2006.01)
*C11D 3/20* (2006.01)

(52) U.S. Cl. .................... 510/175; 510/431; 510/434; 510/436; 134/1.2; 134/1.3

(58) Field of Classification Search ................ 510/175, 510/431, 434, 436; 134/1.2, 1.3
See application file for complete search history.

(56) References Cited

U.S. PATENT DOCUMENTS

| | | | | |
|---|---|---|---|---|
| 4,810,405 A | * | 3/1989 | Waller et al. | 510/253 |
| H953 H | * | 8/1991 | Goto et al. | 430/393 |
| 5,192,460 A | * | 3/1993 | Thomas et al. | 510/238 |
| 5,607,718 A | * | 3/1997 | Sasaki et al. | 438/584 |
| 5,612,304 A | | 3/1997 | Honda et al. | |
| 5,700,383 A | * | 12/1997 | Feller et al. | 438/645 |
| 5,705,089 A | * | 1/1998 | Sugihara et al. | 252/79.1 |
| 5,770,095 A | * | 6/1998 | Sasaki et al. | 216/38 |
| 6,030,932 A | * | 2/2000 | Leon et al. | 510/175 |
| 6,242,407 B1 | * | 6/2001 | Bertacchi et al. | 510/372 |
| 6,265,781 B1 | * | 7/2001 | Andreas | 257/765 |
| 6,387,190 B1 | | 5/2002 | Aoki et al. | |
| 6,395,693 B1 | * | 5/2002 | Wang | 510/175 |
| 6,465,403 B1 | * | 10/2002 | Skee | 510/175 |
| 6,492,308 B1 | * | 12/2002 | Naghshineh et al. | 510/175 |
| 6,585,825 B1 | * | 7/2003 | Skee | 134/3 |
| 6,734,155 B1 | * | 5/2004 | Herbots et al. | 510/392 |
| 2002/0144710 A1 | | 10/2002 | Aoki et al. | |

FOREIGN PATENT DOCUMENTS

| | | | |
|---|---|---|---|
| EP | 7247500 | * | 9/1995 |
| EP | 0812011 A2 | | 12/1997 |
| EP | 0875926 A2 | | 11/1998 |
| EP | 0924970 A2 | | 6/1999 |
| JP | 07247500 | | 9/1995 |
| JP | 11-138113 A | | 5/1999 |
| JP | 11138113 | | 5/1999 |
| JP | 11251280 | | 9/1999 |
| JP | 11-330023 A | | 11/1999 |
| JP | 11330023 A2 | | 11/1999 |
| JP | 2000144193 | | 5/2000 |
| WO | 99/60448 | * | 11/1999 |
| WO | WO-01/24242 A1 | | 4/2001 |
| WO | WO01/36578 A1 | | 5/2001 |

* cited by examiner

*Primary Examiner*—Charles I Boyer
(74) *Attorney, Agent, or Firm*—Birch, Stewart, Kolasch & Birch, LLP

(57) ABSTRACT

To provide a detergent composition which has little corrosion to a wiring material and is excellent in cleaning ability of a semiconductor substrate or semiconductor device on which the fine particles and the metal impurities are deposited. A detergent composition comprising a reducing agent, wherein the detergent composition has an oxidation-reduction potential at 25° C. of +0.2 V or less, and a pH at 25° C. of from 3 to 12; and a cleaning process of a semiconductor substrate or a semiconductor device using the detergent composition.

8 Claims, No Drawings

SEMICONDUCTOR CLEANER COMPRISING A REDUCING AGENT, DISPERSANT, AND PHOSPHONIC ACID-BASED CHELANT

This application is the national phase under 35 U.S.C. § 371 of PCT International Application No. PCT/JP01/05091 which has an International filing date of Jun. 14, 2001, which designated the United States of America.

TECHNICAL FIELD

The present invention relates to a detergent composition used for cleaning a semiconductor substrate or a semiconductor device after a step of forming a semiconductor device on a semiconductor substrate such as a silicon wafer, especially after a CMP (chemical mechanical polishing) step, and a cleaning process for a semiconductor substrate or a semiconductor device using the detergent composition.

BACKGROUND ART

The semiconductor device represented by a silicon semiconductor is highly integrated, and the minimum dimension of a circuit pattern (design rule) in the memory device and logic device is thinned, in order to meet the needs of the market for higher speed and miniaturized scale in its performances. In order to satisfy the demand for fine semiconductor devices, there has been employed a technique for flattening a device surface, such as a CMP method in which the device surface is polished using fine particles of silicon oxide, aluminum oxide, serium oxide, or the like.

For instance, in order to satisfy a multi-layered structure of a circuit pattern, there is a metal CMP method represented by damascene method in which a groove is provided in an interlayer insulation film formed between an upper layer circuit and a lower layer circuit, and a line metal (copper, aluminum, tungsten or the like) is filled into the grooves, and thereafter an excessive metal film is polished.

However, in these steps using CMP method (hereinafter CMP step), there are generated deposition and residues of polishing particles and device-derived inorganic fine particles, and further metal impurities such as iron, copper, aluminum and tungsten derived from a line material on a device, so that these deposited residues cause lattice defects of a substrate, or troubles such as insulation failure and lamination defects of an oxidized film, or breakage of line, or short-circuiting or leakage due to the fine particles entering between the lines, whereby causing quality failure and lowering in production yield. Therefore, a cleaning process is essential.

The tendency described above is more strongly exhibited when the integration degree of the semiconductor device increases and the circuit pattern becomes finer. Therefore, in order to suppress quality worsening or lowering in yield of a manufactured article caused by the finer formation of the circuit patterns, RCA cleaning process has been most widely used as a cleaning process. The RCA cleaning process is roughly divided into two steps depending upon the objects to be removed: The removal of fine particles includes a process using ammonia and an aqueous hydrogen peroxide (SC-1 process); and the removal of metal impurities includes a process using hydrochloric acid and an aqueous hydrogen peroxide (SC-2 process). A cleaning process such as ultrasonic wave (megasonic) in mega-Hertz region, with cleaning with a diluted aqueous hydrofluoric acid, or brush-scrub is also carried out between each of the steps.

However, there arise some problems in the cleaning with hydrofluoric acid used in each step such that since the corrosion to a line metal (copper, tungsten or the like) or the like is large, the film thickness and the line thickness fluctuate, so that a pattern shape of a designed size cannot be obtained, whereby causing wrong influences to properties and qualities such electric properties of the semiconductor device with advanced fineness and thinning. In addition, recently, the fine particles to be removed have become very fine, thereby resulting in difficulty in the removal of the fine particles. Furthermore, the required level of the removal of the metal impurities has become high, so that its required level cannot be satisfactorily met by the above-mentioned RCA cleaning process.

Also, in order to meet the problem of corrosion of line mentioned above and improve the required level of the removal of the metal impurities, a detergent using an organic acid such as oxalic acid or citric acid has been newly developed. However, the above-mentioned problems have not yet been solved thereby.

Further, Japanese Patent Laid-Open No. Hei 11-251280 reports a detergent using a reducing agent and an acid. However, this detergent has a pH of less than 3.0, so that the line metal (especially copper) is corroded. Likewise, the above-mentioned problems have not yet been solved thereby.

DISCLOSURE OF INVENTION

Accordingly, an object of the present invention is to provide a detergent composition which has little corrosion to a line material and is excellent in cleaning ability of a semiconductor substrate or semiconductor device on which the fine particles and the metal impurities are deposited.

Specifically, the present invention relates to:

[1] a detergent composition comprising a reducing agent, wherein the detergent composition has an oxidation-reduction potential at 25° C. of +0.2 V or less, and a pH at 25° C. of from 3 to 12; and

[2] a cleaning process of a semiconductor substrate or a semiconductor device using the detergent composition according to item [1] above.

BEST MODE FOR CARRYING OUT THE INVENTION

The feature of the detergent composition of the present invention, as mentioned above, resides in that the detergent composition comprises a reducing agent, wherein the detergent composition has an oxidation-reduction potential at 25° C. of +0.2 V or less, and a pH at 25° C. of from 3 to 12. By using the detergent composition, there can be improved both the effect of preventing corrosion of metal materials such as line metal, and the effect of removing fine particles and metal impurities from a surface of a semiconductor substrate or a semiconductor device.

The reducing agent includes compounds having lower oxidation states, such as sulfites, thiosulfates, aldehydes, saccharides, sugar alcohols, formic acid and oxalic acid. Concrete examples thereof includes sulfites such as sodium sulfite and ammonium sulfite; thiosulfates such as sodium thiosulfate and ammonium thiosulfate; aldehydes such as formaldehyde and acetaldehyde; saccharides such as pentoses such as arabinose, xylose, ribose, xylulose and ribulose, hexoses such as glucose, mannose, galactose, fructose, sorbose and tagatose, heptoses such as sedoheptulose, disaccharides such as trehalose, saccharose, maltose, cellobiose, gentiobiose and lactose, trisaccharides such as raffinose and maltotriose, and polysaccharides composed of each monosaccharide; sugar alcohols such as pentitols such as arabitol, adonitol and xylitol, and hexitols such as sorbitol, mannitol and dulcitol; formic acid, oxalic acid, succinic acid, lactic acid, malic acid, butyric acid, pyruvic acid, citric acid, 1,4-naphthoquinone-2-sulfonic acid, ascorbic acid, isoascorbic acid, and the like, and derivatives thereof and the like.

Among them, a compound not containing a metal component such as Na and K is preferable, from the viewpoint of not lowering the insulation resistance between the lines of the semiconductor device. Furthermore, ammonium sulfite, ribose, glucose, saccharose, ascorbic acid and isoascorbic acid are more preferred, from the viewpoints of giving more appropriate oxidation-reduction potential and of industrial availability.

The content of the reducing agent is preferably 0.1% by weight or more, more preferably 1.0% by weight or more, of the detergent composition, from the viewpoints of adjusting the oxidation-reduction potential to an appropriate level and of economic advantages. Also, the content of the reducing agent is preferably 30% by weight or less, more preferably 20% by weight or less, especially preferably 10% by weight or less, of the detergent composition, from the viewpoints of residuality of the organic substances on an object to be cleaned and economic advantages.

The oxidation-reduction potential of the detergent composition of the present invention at 25° C. is +0.2 V or less, preferably +0.15 V or less, more preferably +0.1 V or less, especially preferably 0.0 V or less, from the viewpoint of giving the detergent composition a corrosion-preventing ability effective for the metal material such as a line metal. Here, the oxidation-reduction potential refers to that determined by the method described in Examples set forth below.

The pH of the detergent composition of the present invention at 25° C. is from 3 to 12, and the pH can properly take a preferred value within the range of 3 to 12 depending upon an object for removing a semiconductor device or a semiconductor substrate. For instance, the pH is more preferably from 3 to 7, from the viewpoint of removability of the metal impurities, and is more preferably from 7 to 12, from the viewpoint of removability of the fine particles. Here, the pH is referred to that determined by the method described in Examples set forth below.

As the compound used for pH adjustment of the detergent composition, there can be formulated an inorganic or organic base compound.

The base compound is preferably ammonia and organic base compounds, taking into consideration of the influence caused by the electric properties after the CMP step.

The organic base compound includes organic amines, alkanolamines, tetraalkylammonium hydroxides, and the like.

Concrete examples of the organic base compound include dimethylamine, trimethylamine, diethylamine, triethylamine, dibutylamine, octylamine, 2-ethylhexylamine, monoethanolamine, diethanolamine, triethanolamine, methylethanolamine, methyldiethanolamine, dimethylethanolamine, monopropanolamine, dipropanolamine, tripropanolamine, methylpropanolamine, methyldipropanolamine, aminoethylethanolamine, tetramethylammonium hydroxide, and the like.

The weight-average molecular weight of the organic base compound is preferably 30 or more, from the viewpoint of satisfactory removability of the metal impurities. Also, the weight-average molecular weight of the organic base compound is preferably 500 or less, more preferably 300 or less, from the viewpoint of making the residuality of the organic substances to the object to be cleaned little.

It is preferable to contain a dispersant in the detergent composition of the present invention, from the viewpoint of greater improvement in the removability of the fine particles.

The dispersant includes cationic surfactants, anionic surfactants, nonionic surfactants, amphoteric surfactants, and the like. The anionic surfactants are preferable, from the viewpoint of enhancing the removability of the fine particles.

Concrete examples of the anionic surfactant used as the dispersant include polycarboxylic acid compounds such as polyacrylic acids, polymaleic acids and acrylic acid-maleic acid copolymers; polysulfonic acid compounds such as polystyrenesulfonic acids; carboxylic acid-sulfonic acid copolymers such as polyacrylic acid-sulfonic acid copolymer; alkylsulfonic acid-formalin condensate such as naphthalenesulfonic acid-formalin condensate, and salts of organic base compounds thereof.

The base compound as used herein includes a base compound used as a pH adjusting agent, among which the organic base compound is preferable.

The weight-average molecular weight of the anionic surfactant is preferably 300 or more, more preferably 500 or more, from the viewpoint of satisfactory removability of the fine particles. Also, the weight-average molecular weight of the anionic surfactant is preferably 100000 or less, more preferably 50000 or less, especially preferably 30000 or less, from the viewpoint of making the residuality of the organic substances to the object to be cleaned little.

Among them, it is preferable that an anionic surfactant does not contain a metal element such as Na or K in its structure, from the viewpoint of not lowering the insulation resistance between the lines of the semiconductor device.

The content of the dispersant is preferably 0.01% by weight or more, more preferably 0.05% by weight or more, of the detergent composition, from the viewpoint of satisfactory dispersibility of the fine particles. Also, the content of the dispersant is preferably 10% by weight or less, more preferably 5% by weight or less, of the detergent composition, from the viewpoint of suppressing the corrosion of an object to be cleaned.

In addition, it is preferable that a chelating agent is contained in the detergent composition of the present invention, from the viewpoint of greater improvement in the removability of the metal impurities.

The chelating agent includes phosphonic acid-based chelating agents such as aminotri(methylenephosphonic acid), 1-hydroxyethylidene-1,1-diphosphonic acid and ethylenediaminetetramethylenephosphonic acid; aminocarboxylate-based chelating agents such as ethylenediaminetetraacetates and nitrilotriacetates; hydroxyaminocarboxylate-based chelating agents such as dihydroxyethylglycine; and the like. Among them, the phosphonic acid-based chelating agent is preferable, from the viewpoint of the removability of the metal impurities.

The content of the chelating agent is preferably 0.01% by weight or more, more preferably 0.05% by weight or more, of the detergent composition, from the viewpoint of satisfactory removability of the metal impurities. Also, the content of the chelating agent is preferably 20% by weight or less, more preferably 10% by weight or less, of the detergent composition, from the viewpoint of suppressing the corrosion of an object to be cleaned.

Furthermore, it is preferable to contain an organic acid in the detergent composition of the present invention because the removability of the metal impurities can be further enhanced.

The organic acid includes carboxylic acids, peracids, carbonic acid esters, thiocarboxylic acids, mercaptans, sulfonic acids, sulfonic acids, sulfenic acids, sulfuric esters, phosphonic acids, phosphatidic acids, phosphoric ester phosphinic acids, complex compounds of boric esters, and the like. Among them, the carboxylic acids are preferable, from the viewpoint of the removability of the metal impurities, and saturated polycarboxylic acids and hydroxycarboxylic acids are more preferable. Concrete examples thereof include saturated polycarboxylic acids such as oxalic acid, malonic acid and succinic acid; and hydroxycarboxylic acids such as gluconic acid, tartaric acid, malic acid and citric acid. Among them, oxalic acid, malonic acid, malic acid and citric acid are more preferable, from the viewpoint of the removability of the metal impurities.

The content of the organic acid is preferably 0.01% by weight or more, more preferably 0.05% by weight or more, of the detergent composition, from the viewpoint of satisfactory removability of the metal impurities. Also, the content of the organic acid is preferably 50% by weight or less, more preferably 20% by weight or less, of the detergent composition, from the viewpoint of suppressing the corrosion of an object to be cleaned.

It is preferable to add various corrosion-suppressing agents to the detergent composition of the present invention in order to further suppress the corrosion of the line metal. As the corrosion-suppressing agent, it is especially preferable to use a benzotriazole derivative or the like in order to suppress the corrosion of copper.

The content of the corrosion-suppressing agent is preferably 0.005% by weight or more, more preferably 0.01% by weight or more, of the detergent composition, from the viewpoint of exhibiting a corrosion-suppressing effect. Also, the content is preferably 2.0% by weight or less, more preferably 1.0% by weight or less, of the detergent composition, from the viewpoint of solubility to the detergent composition.

In order to accelerate the dissolution of various organic substance such as a polishing accelerator, a polishing rate adjusting agent, a dispersant and a surface-protecting agent in the polishing slurry in the detergent composition of the present invention, an organic solvent can be added thereto.

The organic solvent includes hydrocarbons such as amylbenzene and octane; halogenated hydrocarbons such as allyl chloride and 2-ethylhexyl chloride; alcohols such as amyl alcohol and allyl alcohol; ketones such as methyl ethyl ketone and acetylacetone; esters such as diethyl adipate and ethyl acetoacetate; polyhydric alcohols such as ethylene glycol and propylene glycol; polyhydric alcohol alkyl ethers such as butyl diglycol and ethylene glycol monobutyl ether; carboxylic acids such as isovaleric acid and 2-ethylhexanoic acid and acid anhydrides thereof; phenols such as ethylphenol and octylphenol; nitrogen-containing compounds such as acetamide and aniline; sulfur-containing compounds such as diethylsulfate and thiophene; and fluorine-containing compounds such as dichlorodifluoromethane and trifluoroacetic acid. Among them, the polyhydric alcohols are preferable in consideration of market availability, hazardous nature and the like.

The content of the organic solvent is preferably from 0.5 to 50.0% by weight, more preferably from 1.0 to 20.0% by weight, of the detergent composition.

As the solvent for homogeneously dissolving a reducing agent, a dispersant, a chelating agent, an organic acid and the like, water is preferably used.

Water is not particularly limited as long as it does not hinder the purpose of the detergent composition of the present invention. Water includes, ultrapure water, pure water, ion-exchanged water, distilled water, and the like.

Water is used as the balance of the components. The lower limit of the water content in the detergent composition is preferably 3% by weight or more, more preferably 10% by weight or more, especially preferably 20% by weight or more, from the viewpoints of cleaning ability and homogeneity of the detergent composition.

The detergent composition of the present invention may be used in any of steps for the production steps for a semiconductor device or a semiconductor substrate. Concretely, the detergent composition can be used in a cleaning process after lapping or polishing step of a silicon wafer, in a cleaning process before the production of a semiconductor device, or in a cleaning process during the production steps for a semiconductor device, such as after resist development, after dry etching, after wet etching, after dry ashing, after resist stripping, before or after the CMP treatment, before or after the CVD treatment, or the like. Especially, it is preferable that the detergent composition is used for cleaning after the CMP, from the viewpoints of the removability of the fine particles and the removability of the metal impurities.

The cleaning process of the present invention is a process for cleaning a semiconductor substrate or semiconductor device using the detergent composition of the present invention.

A cleaning means which can be used in the present invention is not particularly limited. There can be used known means such as running water cleaning, immersion cleaning, oscillation cleaning, cleaning utilizing rotation such as a spinner, paddle cleaning, spray cleaning in gas or liquid, and ultrasonic cleaning and brush cleaning. The cleaning means may be carried out alone or in combination of plural means. Also, the semiconductor substrate or semiconductor device may be cleaned one piece at a time in a single cleaning process, or plural pieces at a time. Furthermore, the number of cleaning vessels used for cleaning may be one or plural.

The temperature of the detergent composition during cleaning is not particularly limited. The temperature is preferably within the range of from 20° to 100° C., from the viewpoints of suppression of corrosion, removability of the fine particles, removability of the metal impurities, safety and operability.

The semiconductor substrate and semiconductor device which are treated by the cleaning process have very little corrosion of the metal materials such as line metal, and the amounts of the fine particles and the metal impurities deposited on the surface are very small.

The present invention will be described in further detail by means of the working examples, without intending to limit the scope of the present invention thereto.

EXAMPLES 1 TO 17 AND COMPARATIVE EXAMPLES 1 TO 4

[Preparation of Detergent Composition]

Prior to carrying out the evaluation tests, the detergent compositions each having a composition shown in Table 1 was prepared. The composition is each expressed by % by weight. A pH of the detergent composition was adjusted by a pH adjusting agent shown in Table 1. Also, compounds A to U used in the preparation of the detergent compositions are shown in Table 2.

TABLE 1

| | Example No. | | | | | | | | | | |
|---|---|---|---|---|---|---|---|---|---|---|---|
| | 1 | 2 | 3 | 4 | 5 | 6 | 7 | 8 | 9 | 10 | 11 |
| Composition Ingredient (% by weight) | | | | | | | | | | | |
| Reducing Agent | | | | | | | | | | | |
| A | | | | | 3.0 | | | | | | |
| B | 10.0 | 5.0 | 1.0 | 0.1 | | 10.0 | 5.0 | | | 5.0 | |
| C | | | | | | | | 5.0 | | | |
| D | | | | | | | | | 5.0 | | |
| E | | | | | | | | | | | 5.0 |
| F | | | | | | | | | | | |
| G | | | | | | | | | | | |
| Dispersant | | | | | | | | | | | |
| H | | | | | 5.0 | | | | | | |
| I | 5.0 | 5.0 | 5.0 | 5.0 | | | 5.0 | 5.0 | 5.0 | 5.0 | 5.0 |
| R | | | | | | | | | | | |
| Chelating Agent | | | | | | | | | | | |
| J | 3.0 | 3.0 | 3.0 | 3.0 | | 1.0 | 3.0 | 3.0 | 3.0 | | 3.0 |
| K | | | | | | | | | | | |
| Anticorrosive Agent | | | | | | | | | | | |
| L | | | | | | | 1.0 | | | | |
| pH Adjusting Agent | | | | | | | | | | | |
| M | 10.0 | 9.2 | 6.3 | 5.7 | | | 9.9 | 5.6 | 5.5 | 7.1 | 9.3 |
| N | | | | | 0.9 | 2.1 | | | | | |
| S | | | | | | | | | | | |
| T | | | | | | | | | | | |
| U | | | | | | | | | | | |
| Organic Acid | | | | | | | | | | | |
| O | | | | | | | | | | 0.5 | |
| Solvent | | | | | | | | | | | |
| P | 5.0 | 5.0 | 5.0 | 5.0 | | | 5.0 | 5.0 | 5.0 | 5.0 | 5.0 |
| Q | 67.0 | 72.8 | 79.7 | 81.2 | 91.1 | 86.9 | 71.1 | 76.4 | 76.5 | 77.4 | 72.7 |

| | Example No. | | | | | | Comparative Example No. | | | |
|---|---|---|---|---|---|---|---|---|---|---|
| | 12 | 13 | 14 | 15 | 16 | 17 | 1 | 2 | 3 | 4 |
| Composition Ingredient (% by weight) | | | | | | | | | | |
| Reducing Agent | | | | | | | | | | |
| A | | | | 5.0 | 5.0 | | | | | |
| B | | | 2.0 | | | | | 0.05 | 10.0 | |
| C | | | | | | 5.0 | | | | |
| D | | | | | | | | | | 0.7 |
| E | | | | | | | | | | |
| F | 5.0 | | | | | | | | | |
| G | | 10.0 | | | | | | | | |
| Dispersant | | | | | | | | | | |
| H | | | | | | | | | | |
| I | 5.0 | 5.0 | 5.0 | | | | 5.0 | 5.0 | | 0.4 |
| R | | | | 5.0 | 5.0 | 5.0 | | | | |
| Chelating Agent | | | | | | | | | | |
| J | 3.0 | | | 3.0 | 3.0 | 3.0 | 3.0 | 3.0 | 1.0 | 0.4 |
| K | | 3.0 | 3.0 | | | | | | | |
| Anticorrosive Agent | | | | | | | | | | |
| L | | | | | | | | | | |
| pH Adjusting Agent | | | | | | | | | | |
| M | 5.8 | 5.7 | 7.0 | | | | 5.4 | 5.5 | | |
| N | | | | | | | | | | 65.2 |
| S | | | | 7.0 | 7.0 | 7.0 | | | | |

TABLE 1-continued

| | | | | | | | | | | |
|---|---|---|---|---|---|---|---|---|---|---|
| T | | | | | 3.0 | | | | | |
| U | | | | 3.0 | | 3.0 | | | | |
| Organic Acid | | | | | | | | | | |
| O | | | | | | | | | | |
| Solvent | | | | | | | | | | |
| P | 5.0 | 5.0 | 5.0 | 5.0 | 5.0 | 5.0 | 5.0 | 5.0 | | |
| Q | 76.2 | 71.3 | 78.0 | 72.0 | 72.0 | 72.0 | 81.6 | 81.45 | 89.0 | 33.3 |

TABLE 2

| | | Name of Compounds |
|---|---|---|
| Reducing Agent | A | Ammonium sulfite |
| | B | L-Ascorbic acid |
| | C | D-Ribose |
| | D | D-Glucose |
| | E | D-Isoascorbic acid |
| | F | Saccharose |
| | G | Maltose monohydrate |
| Dispersant | H | Ammonium salt of polynaphthalenesulfonic acid formalin condensate (trade name: DEMOL AS, manufactured by Kao Corporation) |
| | I | Acrylic acid-2-acrylamide-2-methylsulfonic acid copolymer (average molecular weight: 2000) |
| | R | Polyacrylic acid (average molecular weight: 6000) |
| Chelating Agent | J | Aminotri(methylenephosphonic acid) (trade name: DEQUEST 2000, manufactured by Nippon Monsanto K.K.) |
| | K | 1-hydroxyethylidene-1,1-diphosphonic acid (trade name: DEQUEST 2010, manufactured by Nippon Monsanto K.K.) |
| Anticorrosive Agent | L | 1,2,3-Benzotriazole |
| pH Adjusting Agent | M | Dimethylethanolamine |
| | N | Aqueous ammonia (25%) |
| | S | Monoethanolamine |
| | T | Diethanolamine |
| | U | Triethanolamine |
| Organic Acid | O | Oxalic acid |
| Solvent | P | Butyl diglycol |
| | Q | Ultrapure Water |

The removabilities of metal impurities and fine particles and the corrosiveness of line metal were evaluated using each of the resulting detergent compositions under the following conditions.

Here, an ORP combination electrode (model number: PST-5421C) was attached to a pH meter (model number: HM-30V) manufactured by Toa Denpa Kogyo K.K., and the oxidation-reduction potential of a detergent composition was determined at 25° C. with 50 ml of the detergent composition using the pH meter.

When the oxidation-reduction potential was determined, in order to judge whether or not the metal electrode is functioning normally, the metal electrode was checked with quinhydrone solution as follows.

The amount 0.5 g of quinhydrone stored at a low temperature in a shielding bottle was added to 100 ml of a pH standard solution of phthalate (0.05 mol/dm$^3$ potassium hydrogen phthalate solution), with mixing the contents, to give a "quinhydrone checking solution." The blending together of the checking solution was carried out for each metal electrode checking, from the viewpoint of the stability of the solution.

The above-mentioned combination electrode (metal electrode and reference electrode (silver chloride electrode)) was immersed in the above-mentioned quinhydrone checking solution at 25° C. Judging that the metal electrode was functioning normally if the potential value at that time was within 0.256±0.01 V, the oxidation-reduction potential of the detergent composition was determined.

Incidentally, regarding a case where the potential was not within the indicated range in the above-mentioned method, the electrode was sufficiently cleaned and checked again until the potential was within the indicated range.

The oxidation-reduction potential in the present invention is an oxidation-reduction potential which is obtained by adding a potential difference of a single electrode (0.206 V, 25° C.) of the silver chloride electrode, the Reference Electrode, to a potential value as determined by the above-mentioned method.

In addition, a pH combination electrode (model number: GST-5421C) was attached to a pH meter (model number: HM-30V) manufactured by Toa Denpa Kogyo K.K., and the pH of a detergent composition was determined at 25° C. with 50 ml of the detergent composition using the pH meter.

[Removability of Metal Impurities]

1. Preparation of Metal Contaminated Solution

Iron chloride and copper sulfate were added to ultrapure water to prepare a contaminated solution (A) having each of the iron concentration and the copper concentration of 20 ppm. The contaminated solution (A) was a metal contaminated solution supposing that the metal impurities remain on a copper-plated silicon wafer surface.

2. Evaluation of Cleaning

A copper-plated silicon wafer having a diameter of 7.5 cm was set on a spinner, and 1 mL of the contaminated solution (A) was added to the wafer surface. The wafer was rotated so that the contaminated solution (A) was applied even on the entire wafer surface, to prepare a metal-contaminated wafer. The metal-contaminated wafer was cleaned using the following cleaning process and rinsing process.

Cleaning Process

The metal-contaminated wafer was subjected to ultrasonic cleaning in a clean room kept at 23° C. The conditions are shown below.

Operated ultrasonic wave: 1.7 MHz, 48 W

Nozzle diameter: 4 mm diameter

Feeding amount of detergent composition: 2 L/min

Amount of detergent composition used: 2 L

Cleaning time: 30 seconds

Rinsing Process

The metal-contaminated wafer subjected to cleaning treatment according to the above-mentioned cleaning process was rinsed using the above-mentioned ultrasonic nozzle, with allowing ultrapure water to flow therethrough. The conditions for rinsing are the same as the above-mentioned cleaning conditions.

Evaluation

Evaluation of the removability of the metal impurities:
After drying the wafer for which rinsing was terminated, the amounts of elemental iron and copper remaining on the wafer surface were determined at three determination points by using a total reflection-type fluorescent X-ray wafer surface analyzer (manufactured by K.K. Technos IT, trade name TREX 610T). Thereafter, the removability of the metal impurities (cleaning ability) was evaluated in accordance with the following criteria. The results are shown in Tables 3 and 4. Here, the following remaining amount of the metal impurities is an average value at the three determination points.

⊚: the remaining amount of the metal impurities being less than $10^{10}$ atoms/cm$^2$;

○: the remaining amount of the metal impurities being $10^{10}$ atoms/cm$^2$ or more and less than $10^{11}$ atoms/cm$^2$; and X: the remaining amount of the metal impurities being $10^{11}$ atoms/cm$^2$ or more.

[Removability of Fine Particles]

1. Preparation of Test Piece

A polishing test was carried by using a single-sided polishing machine manufactured by Engis Corporation (disc size: 30 cm), and thereafter a test for removing fine particles was conducted. The conditions for the polishing test are as follows.

Polishing pad: upper face: IC-1000, lower face: SUBA400
Load: 300 gf/cm$^2$
Slurry: abrasive grains: SNOWTEX ZL manufactured by Nissan Chemical Industries, Ltd. (primary particle size: 50 nm), pH=8, feeding rate: 50 to 60 mL/min
number of rotations: disk: 60 rpm, work: 50 rpm (disk and work being rotated in the same direction)
polishing time: 5 min.
test sample for polishing: 2 inch-silicon wafer with copper film The polishing test was carried out under the above-mentioned conditions, and the test pieces were used for the removable of the fine particles.

2. Evaluation of Cleaning

The polished test piece was cleaned under the same conditions as those used in the evaluation of the removability of the metal impurities mentioned above. Thereafter, the copper film surface was dissolved in and extracted with an aqueous hydrochloric acid, and the fine particles in the extract were counted with a particle counter (manufactured by Horiba LTD., trade name: Laser Diffraction Particle Size Distribution Analyzer, model number: LA-500). The cleaning was evaluated in accordance with the following criteria. The results are shown in Tables 3 and 4.

⊚: the remaining amount of the fine particles being 10/mL or less;

○: the remaining amount of the fine particles being 11/mL or more and 50/mL or less; and X: the remaining amount of the fine particles being 51/mL or more.

[Corrosiveness of Line Metal]

The reflectance was determined with an angle of incidence and a measured angle of 60° using a wafer after the evaluation of cleaning by the above-mentioned removability of the metal impurities with a digital gloss meter (manufactured by MURAKAMI COLOR RESEARCH LABORATORY, trade name GLOSS METER (model number: GM-3D)). The reflectance was compared with that before the metal-contamination treatment, and evaluated in accordance with the following criteria.

⊚: the change (amount loss) in reflectance before and after cleaning being less than 3%;

○: the change (amount loss) in reflectance before and after cleaning being 3% or more and less than 5%; and X: the change (amount loss) in reflectance before and after cleaning being 5% or more.

TABLE 3

|  | Example No. | | | | | | | | |
| --- | --- | --- | --- | --- | --- | --- | --- | --- | --- |
|  | 1 | 2 | 3 | 4 | 5 | 6 | 7 | 8 | 9 |
| Oxidation-Reduction Potential (V) | −0.12 | −0.10 | −0.07 | +0.10 | +0.15 | +0.19 | −0.12 | +0.15 | +0.19 |
| pH | 9.1 | 9.2 | 9.0 | 9.0 | 9.0 | 4.0 | 9.0 | 9.0 | 9.0 |
| Preventing Ability of Corrosiveness of Metal Wiring | ⊚ | ⊚ | ⊚ | ⊚ | ⊚ | ○ | ⊚ | ⊚ | ○ |
| Removability of Microfine Particles | ⊚ | ⊚ | ⊚ | ⊚ | ⊚ | ○ | ⊚ | ⊚ | ⊚ |
| Removability of Metal Impurities | ⊚ | ⊚ | ⊚ | ⊚ | ○ | ⊚ | ⊚ | ⊚ | ⊚ |

|  | Example No. | | | | | | | |
| --- | --- | --- | --- | --- | --- | --- | --- | --- |
|  | 10 | 11 | 12 | 13 | 14 | 15 | 16 | 17 |
| Oxidation-Reduction Potential (V) | −0.11 | −0.14 | +0.18 | +0.19 | −0.13 | −0.08 | −0.08 | −0.1 |
| pH | 9.0 | 9.0 | 9.0 | 9.0 | 9.0 | 9.0 | 9.0 | 9.0 |
| Preventing Ability of Corrosiveness of Metal Wiring | ⊚ | ⊚ | ○ | ○ | ⊚ | ⊚ | ⊚ | ⊚ |
| Removability of Microfine Particles | ⊚ | ⊚ | ⊚ | ⊚ | ⊚ | ⊚ | ⊚ | ⊚ |
| Removability of Metal Impurities | ⊚ | ⊚ | ⊚ | ⊚ | ⊚ | ⊚ | ⊚ | ⊚ |

TABLE 4

|  | Comparative Example No. | | | |
| --- | --- | --- | --- | --- |
|  | 1 | 2 | 3 | 4 |
| Oxidation-Reduction Potential (V) | +0.24 | +0.21 | +0.19 | +0.04 |
| pH | 9.1 | 9.1 | 1.5 | 12.5 |
| Preventing Ability of Corrosiveness of Metal Wiring | X | X | X | X |
| Removability of Microfine Particles | ◎ | ◎ | X | ◎ |
| Removability of Metal Impurities | ◎ | ◎ | ◎ | ○ |

It can be seen from the results of Tables 3 and 4 that the detergent composition of the present invention (Examples 1 to 17) have little corrosiveness to line metal, and are excellent in the removability of the fine particles and the removability of the metal impurities. On the other hand, in the cases where the oxidation-reduction potential is higher than 0.2 V, the corrosion of the line metal could not be prevented, although the removabilities of the fine particles and the metal impurities were excellent (Comparative Examples 1 and 2). Further, in cases where pH is less than 3 or exceeds 12, the corrosion of the line metal could not be prevented (Comparative Examples 3 and 4).

INDUSTRIAL APPLICABILITY

The detergent composition of the present invention is excellent in the cleaning ability of the semiconductor substrate or the semiconductor device on which the fine particles and the metal impurities are deposited, and is excellent in little corrosion to metal materials such as line metals. Therefore, by using the detergent composition, a pattern formation of a designed size is obtained without changing the film thickness of the line metal and line width. Therefore, the integration degree of the semiconductor device increases, so that the semiconductor substrate or semiconductor device having excellent electric properties and qualities, even with the progress of the fine formation of the circuit pattern.

The invention claimed is:

1. A cleaning process of a semiconductor substrate or a semiconductor device comprising a step of:
   washing a semiconductor substrate or a semiconductor device with a detergent composition comprising a reducing agent, a chelating agent, and a dispersant selected from the group consisting of polyacrylic acid-sulfonic acid copolymer, naphthalenesulfonic acid-formalin condensate, and salts of organic base compounds thereof, wherein the detergent composition has an oxidation-reduction potential at 25° C. of +0.2 V or less, and a pH at 25° C. of from 3 to 12, and wherein the chelating agent is a phosphonic acid-based chelating agent, wherein
   the reducing agent is at least one compound selected from the group consisting of ammonium sulfite, ribose, glucose, saccharose and isoascorbic acid, and
   the semiconductor substrate or the semiconductor device has a line metal and the line metal is copper.

2. A method for preventing corrosion of a metal material, comprising a step of:
   washing a semiconductor substrate or a semiconductor device with a detergent composition comprising a reducing agent, a chelating agent, and a dispersant selected from the group consisting of polyacrylic acid-sulfonic acid copolymer, napthalenesulfonic acid-formalin condensate, and salts of organic base compounds thereof, wherein the detergent composition has an oxidation-reduction potential at 25° C. of +0.2 V or less, and a pH at 25° C. of from 3 to 12, and wherein the chelating agent is a phosphonic acid-based chelating agent, after CMP step, wherein
   the reducing agent is at least one compound selected from the group consisting of ammonium sulfite, ribose, glucose, saccharose and isoascorbic acid, and
   the semiconductor substrate or the semiconductor device has a line metal and the line metal is copper.

3. The cleaning process of a semiconductor substrate or a semiconductor device according to claim 1, wherein the phosphonic acid-based chelating agent is contained in the detergent composition in an amount of from 3.0 to 20% by weight.

4. The method for preventing corrosion of a metal material according to claim 2, wherein the phosphonic acid-based chelating agent is contained in the detergent composition in an amount of from 3.0 to 20% by weight.

5. The cleaning process of a semiconductor substrate or a semiconductor device according to claim 1, wherein the reducing agent is contained in the detergent composition in an amount of from 2.0 to 30% by weight.

6. The method for preventing corrosion of a metal material according to claim 2, wherein the reducing agent is contained in the detergent composition in an amount of from 2.0 to 30% by weight.

7. A cleaning process of a semiconductor substrate or a semiconductor device comprising a step of:
   washing a semiconductor substrate or a semiconductor device with a detergent composition comprising a reducing agent, a chelating agent, and a dispersant selected from the group consisting of polycarboxylic acid compounds, polysulfonic acid compounds, carboxylic acid-sulfonic acid copolymers, alkylsulfonic acid-formalin condensate, and salts of organic base compounds thereof, wherein the detergent composition has an oxidation-reduction potential at 25° C. of +0.2 V or less, and a pH at 25° C. of from 3 to 12, and wherein the chelating agent is a phosphonic acid-based chelating agent, wherein
   the reducing agent is at least one compound selected from the group consisting of ammonium sulfite, ribose, glucose, saccharose and isoascorbic acid,
   the semiconductor substrate or the semiconductor device has a line metal and the line metal is copper, and
   the phosphonic acid-based chelating agent is contained in the detergent composition in an amount of from 3.0 to 20% by weight.

8. A method for preventing corrosion of a metal material, comprising a step of:
   washing a semiconductor substrate or a semiconductor device with a detergent composition comprising a reducing agent, a chelating agent, and a dispersant selected from the group consisting of polycarboxylic acid compounds, polysulfonic acid compounds, carboxylic acid-sulfonic acid copolymers, alkylsulfonic acid-formalin condensate, and salts of organic base compounds thereof, wherein the detergent composition has an oxidation-reduction potential at 25° C. of +0.2 V or less, and a pH at 25° C. of from 3 to 12, and wherein the chelating agent is a phosphonic acid-based chelating agent, after CMP step, wherein the reducing agent is at least one compound selected from the group consisting of ammonium sulfite, ribose, glucose, saccharose and isoascorbic acid, the semiconductor substrate or the semiconductor device has a line metal and the line metal is copper, and the phosphonic acid-based chelating agent is contained in the detergent composition in an amount of from 3.0 to 20% by weight.

* * * * *